(12) United States Patent
Sabatini et al.

(10) Patent No.: US 8,940,582 B2
(45) Date of Patent: Jan. 27, 2015

(54) STACKABLE ELECTRONIC PACKAGE AND METHOD OF FABRICATING SAME

(71) Applicant: General Electric Company, Schenectady, NY (US)

(72) Inventors: James Sabatini, Scotia, NY (US); Christopher James Kapusta, Delanson, NY (US); Glenn Forman, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/969,965

(22) Filed: Aug. 19, 2013

(65) Prior Publication Data

US 2013/0344653 A1    Dec. 26, 2013

Related U.S. Application Data

(62) Division of application No. 13/101,249, filed on May 5, 2011, now Pat. No. 8,536,700, which is a division of application No. 12/410,237, filed on Mar. 24, 2009, now Pat. No. 8,026,608.

(51) Int. Cl.
    *H01L 21/56*    (2006.01)

(52) U.S. Cl.
    USPC ............................ 438/109; 438/119; 438/127

(58) Field of Classification Search
    USPC .................... 438/106–110, 118, 119, 127; 257/E23.116, E23.169, E23.178
    See application file for complete search history.

(56) References Cited

U.S. PATENT DOCUMENTS

| | | |
|---|---|---|
| 3,942,245 A | 3/1976 | Jackson et al. |
| 4,783,695 A | 11/1988 | Eichelberger et al. |
| 5,324,687 A | 6/1994 | Wojnarowski |
| 5,353,498 A | 10/1994 | Fillion et al. |
| 5,373,627 A | 12/1994 | Grebe |
| 6,255,137 B1 | 7/2001 | Gorczyca et al. |
| 6,284,564 B1 | 9/2001 | Balch et al. |
| 6,294,741 B1 | 9/2001 | Cole, Jr. et al. |
| 6,602,739 B1 | 8/2003 | Rose et al. |
| 7,327,039 B2 | 2/2008 | Charles et al. |
| 7,521,812 B2 | 4/2009 | Lee et al. |
| 7,550,857 B1 * | 6/2009 | Longo et al. .............. 257/777 |
| 7,863,090 B2 | 1/2011 | Eichelberger et al. |

(Continued)

OTHER PUBLICATIONS

Forman et al., "Development of GE's Plastic Thin-Zero Outline Package (TZOP) Technology," IEEE Xplore, 1995, pp. 664-668.

(Continued)

*Primary Examiner* — Marcos D. Pizarro
(74) *Attorney, Agent, or Firm* — Ziolkowski Patent Solutions Group, SC; Jean K. Testa

(57) ABSTRACT

An electronic package includes a first layer having a first surface, the first layer includes a first device having a first electrical node, and a first contact pad in electrical communication with the first electrical node and positioned within the first surface. The package includes a second layer having a second surface and a third surface, the second layer includes a first conductor positioned within the second surface and a second contact pad positioned within the third surface and in electrical communication with the first conductor. A first anisotropic conducting paste (ACP) is positioned between the first contact pad and the first conductor to electrically connect the first contact pad to the first conductor such that an electrical signal may pass therebetween.

8 Claims, 5 Drawing Sheets

(56) References Cited

U.S. PATENT DOCUMENTS

2005/0001326 A1    1/2005  Masuda
2005/0287785 A1*  12/2005  Lee ............................. 438/613
2006/0208356 A1    9/2006  Yamano et al.
2009/0039491 A1    2/2009  Kim et al.

OTHER PUBLICATIONS

Fillion et al., "Reliability Evaluation of Chip-on-Flex CSP Devices," 1998 international Conference on Multichip Modules and High Density Packaging, IEEE Xplore, 1998, pp. 242-246.

Package on Package (PoP) Family, Amkor Technology, http://www.amkor.com/go/packaging/all-packages/psvfbga/psvfbga-package-stackable-ver . . . .

High Density Interconnect Technology, General Electric, Inc., Hanover, MD, 1999, http://www.mdatechnology.net/techprofile.aspx?id=439.

\* cited by examiner

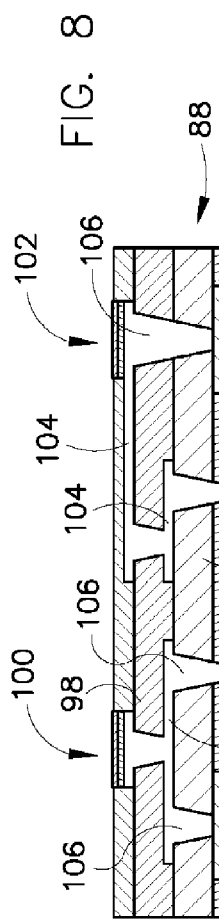
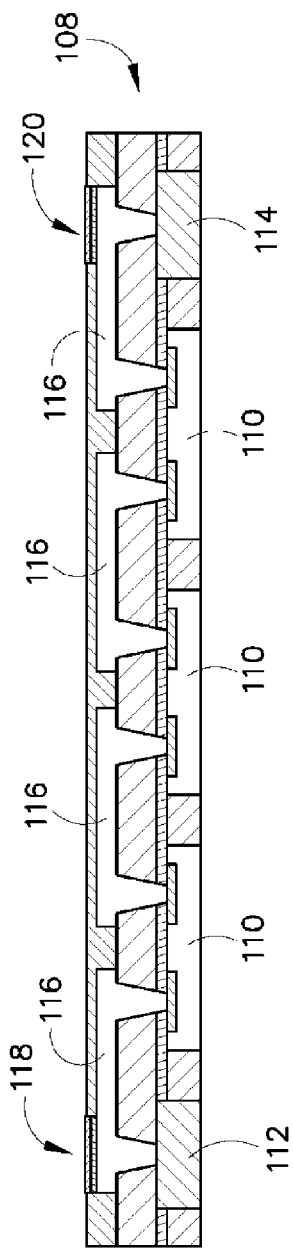
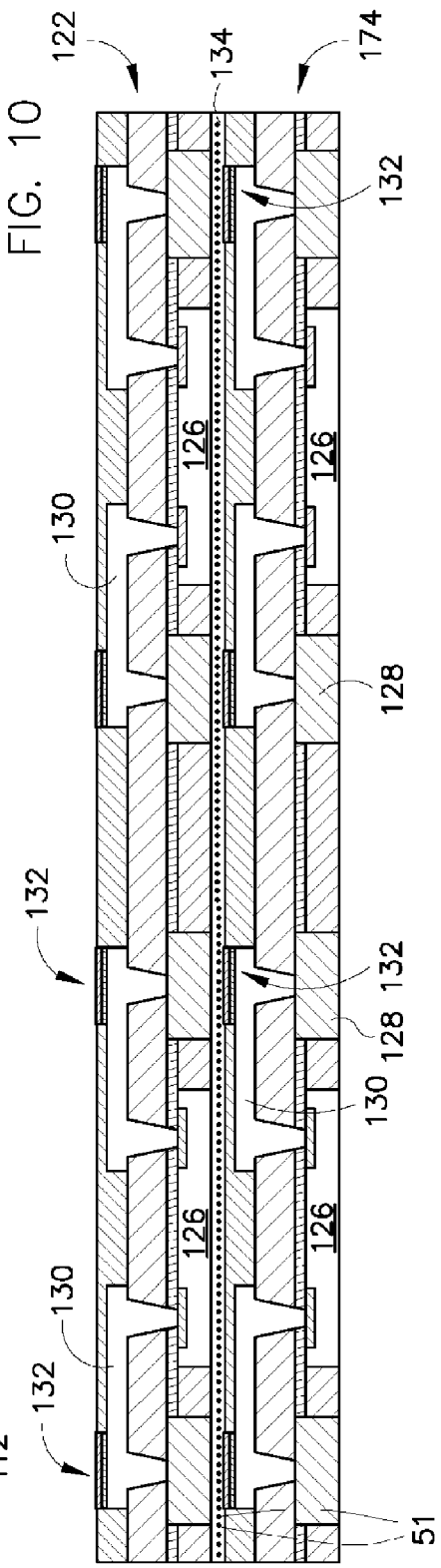

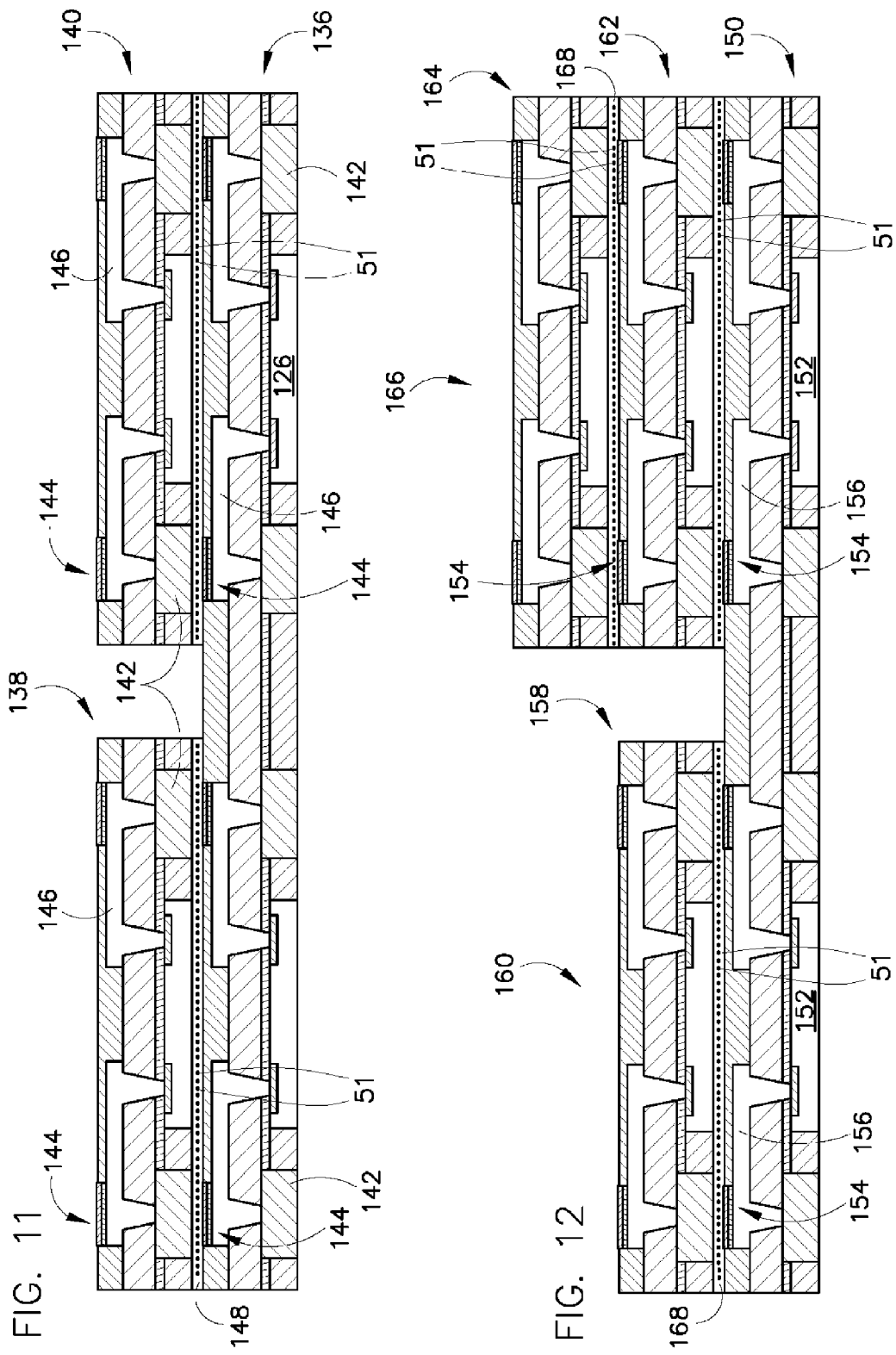

STACKABLE ELECTRONIC PACKAGE AND METHOD OF FABRICATING SAME

CROSS REFERENCE TO RELATED APPLICATIONS

The present application is a divisional of and claims priority to U.S. Ser. No. 13/101,249, filed on May 5, 2011, which is a divisional of and claims priority to U.S. Ser. No. 12/410,237, filed on Mar. 24, 2009, now issued as U.S. Pat. No. 8,026,608, the disclosures of which are incorporated herein.

GOVERNMENT RIGHTS IN THE INVENTION

This invention was made with Government support under grant number FA9453-04-C-003 awarded by the Air Force Research Laboratory. The Government has certain rights in the invention.

BACKGROUND OF THE INVENTION

The invention relates generally to integrated circuit packages and, more particularly, to an apparatus and method of fabricating a package having a reduced stacking height thereof.

Integrated circuit (IC) packages are typically fabricated having a number of embedded silicon devices such as memory chips, microprocessors, translation circuitry, buffering, switching, and the like. In order to combine and increase functionality of an IC, it is often desirable to stack and interconnect various die types into a single device or package. Thus, embedded chip packages can be manufactured having a plurality of chips or electronic components in a stacked 3D arrangement. The plurality of chips or electronic components are electrically connected to an input/output system by way of metal interconnects routed through a plurality of laminate re-distribution layers.

Advancements in IC packaging requirements pose challenges to the existing embedded chip build-up process. That is, it is desired in many current embedded chip packages to have an increased number of re-distribution layers, with eight or more re-distribution layers being common. The advancements are driven by ever-increasing needs for achieving better performance, greater miniaturization, and higher reliability. New packaging technology also has to further provide for the possibilities of batch production for the purpose of large-scale manufacturing thereby allowing economy of scale. Thus, as ICs become increasingly smaller and yield better operating performance, packaging technology has correspondingly evolved from leaded packaging, to laminate-based ball grid array (BGA) packaging, to chip-scale packaging (CSP), to flipchip packages, and to embedded chip build-up packaging.

There are a variety of known methods for stacking die to form a stacked package. One method includes stacking on the wafer level. In this approach, the dies are kept in wafer format and are stacked on top of each other and bonded together at high temperatures. Typically the layer-layer connections are formed by thru silicon vias. However, this method limits the mixing of die types that can be intermixed in the IC package. Another method is by stacking on the individual die level. Typically this method includes mounting a single die to a lead frame chip carrier interconnect platform and additional dies are then glued and stacked on top of each other. The interconnect is then formed by wirebonding to the exposed pads of the stacked die and to an I/O of the lead frame. However, this arrangement also limits the use of die types to those having perimeter connections and pyramid die stacking.

Additionally, these stacking methods typically result in an unacceptably thick package height. In order to handle and process the die (in either wafer format or as individual die), each must be typically 250 microns or greater in thickness. Thus, when in final package form, an 8-layer structure, for example, may be 2 mm or more in thickness. Such a package may be cumbersome to work with, expensive to fabricate and process, and may be fragile to handle for subsequent processing and usage. Also, such limitations may limit the overall number of layers in the final package if there is a restrictive total package thickness for the final application, thus limiting the functionality and performance.

Accordingly there is a need for a method for embedded chip fabrication that allows for the application of multiple dies and die types in a stacked arrangement with a reduced overall stack height. There is a further need for embedded chip fabrication that allows for the application of multiple re-distribution layers and also provides a simple flexible stacking method.

It would therefore be desirable to have a system and method capable of processing and fabricating a stacked IC package having a reduced package thickness.

BRIEF DESCRIPTION OF THE INVENTION

The invention provides a system and method of processing and fabricating a stacked IC package having a reduced package thickness.

In accordance with one aspect of the invention, an electronic package includes an electronic package includes a first layer having a first surface, the first layer includes a first device having a first electrical node, and a first contact pad in electrical communication with the first electrical node and positioned within the first surface. The package includes a second layer having a second surface and a third surface, the second layer includes a first conductor positioned within the second surface and a second contact pad positioned within the third surface and in electrical communication with the first conductor. A first anisotropic conducting paste (ACP) is positioned between the first contact pad and the first conductor to electrically connect the first contact pad to the first conductor such that an electrical signal may pass therebetween.

In accordance with another aspect of the invention, a method of fabricating an electronic package includes forming a first sub-assembly layer having a first silicon device therein, the first sub-assembly layer having a first surface, forming a first interface material in the first sub-assembly layer such that the first surface includes the first interface material, electrically connecting a node of the first silicon device to the first interface material, and forming a second sub-assembly layer having a second surface and a third surface. The method further includes forming a conductor in the second sub-assembly layer such that the second surface includes the conductor, forming a second interface material in the second sub-assembly layer such that the third surface includes the second interface material, electrically connecting the conductor to the second interface material, and compressing an anisotropic conductive paste (ACP) between the first sub-assembly layer and the second sub-assembly layer such that the first interface material is electrically connected with the conductor.

In accordance with yet another aspect of the invention, an electronic package includes a plurality of die package sub-layers, each sub-layer having a first surface and a second surface. Each sub-layer includes a device having one or more electrical nodes, a first contact pad electrically connected to one of the one or more electrical nodes, the first surface comprising the first contact pad, a second surface comprising a conductor, and an electrical feedthrough configured to pass an electrical signal from the conductor to the first contact pad. A paste including a plurality of solder balls that conduct electrical signals is positioned between the plurality of sub-layers such that the first contact pad of one sub-layer is electrically connected to the conductor of an adjacent sub-layer.

Various other features and advantages will be made apparent from the following detailed description and the drawings.

BRIEF DESCRIPTION OF THE DRAWINGS

The drawings illustrate one preferred embodiment presently contemplated for carrying out the invention.

In the drawings:

FIGS. 8 and 9 are schematic block diagrams showing a chip scale package in accordance with embodiments of the invention.

FIGS. 10-12 are schematic block diagrams showing a multi-layer chip scale package in accordance with embodiments of the invention.

DETAILED DESCRIPTION OF THE PREFERRED EMBODIMENT

Figure 1:
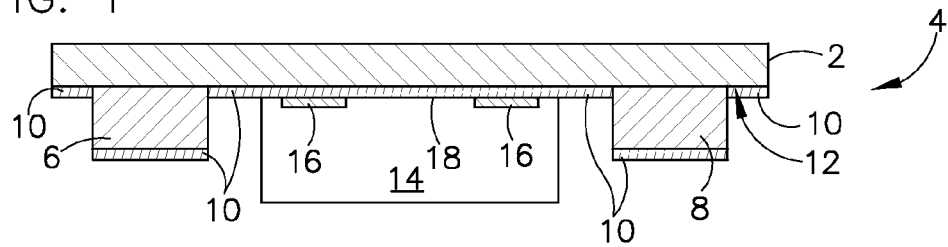
FIGS. 1-5 are schematic block diagrams showing steps of making a chip scale package in accordance with an embodiment of the invention.

FIGS. 1-5 are schematic block diagrams showing steps of making a chip scale package in accordance with an embodiment of the invention. FIG. 1 shows a dielectric film or flex material 2 of a first chip scale package layer 4 having electrically conductive materials 6, 8 (such as copper) applied thereto. In another embodiment, flex material 2 is formed of a dielectric material such as Kapton having a thickness of 25 microns, for example. A layer of adhesive 10 is applied to a first side 12 thereof, which is also incidentally applied to materials 6, 8 as well. A die 14 having a plurality of contact nodes or pads 16 attached to or contained within an active surface 18 thereof is coupled or attached to first side 12 of flex material 2 via adhesive layer 10. In one embodiment, die 14 is placed into adhesive layer 10 using conventional pick and place equipment and methods. While FIG. 1 shows a die attached the flex material, in another embodiment of the invention, an electronic component 14 other than a die such as an active or passive electronic device may be attached to flex material 2. Additionally, it is contemplated that a plurality of electronic components 14 may be attached to flex material 2 such that a multi-component module or layer may be formed.

Figure 2:
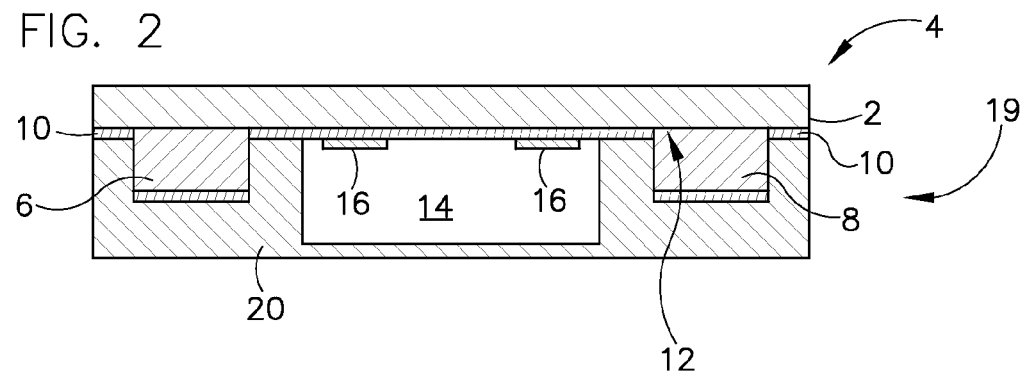
Figure 3:
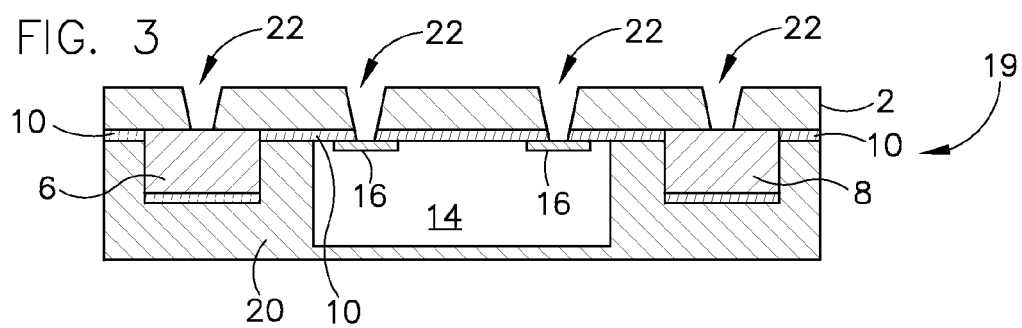

FIG. 2 shows a sub-assembly 19 of embedding compound or encapsulant 20 applied to the assembly 4 of FIG. 1 and encapsulating die 14 and materials 6, 8 according to an embodiment of the invention. In another embodiment, encapsulant 20 extends away from the first side 12 of flex material 2 but does not completely cover die 14 or materials 6, 8. In one embodiment, encapsulant 20 is an epoxy. Encapsulant 20 is then allowed to cure. As shown in FIG. 3, once encapsulant 20 of sub-assembly 19 is cured, a plurality of vias 22 are formed through flex material 2 and adhesive 10 to expose contact pads 16 and materials 6, 8. In embodiments of the invention, vias 22 are formed via a laser drilling process or a dry etching process, as examples. In still another embodiment, embedding compound or encapsulant 20 is excluded completely from the process and all subsequent sub-assemblies and layers, as will be described, can be fabricated and assembled having no material 20 therein.

Figure 4:
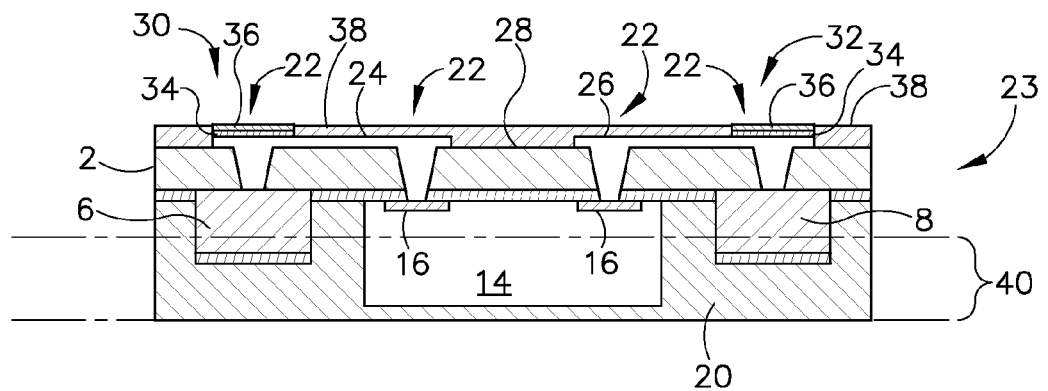

FIG. 4 shows a sub-assembly 23 formed using sub-assembly 19 of FIG. 3. Sub-assembly 23 includes a pair of metallization paths 24, 26 formed on a second side 28 of flex material 2 and extending through vias 22 to couple respective contact pads 16 to respective materials 6, 8. In embodiments of the invention, metallization paths 24, 26 have a thickness up to approximately 4 microns above second side 28, for example. Metallization paths 24, 26 may comprise, for example, a layer of copper coupled to a layer of titanium. A plurality of interface materials or feed-thru pads 30, 32 comprising a layer of nickel 34 and a layer of gold 36 are formed or plated onto metallization paths 24, 26. In one embodiment, a combined thickness of the layers of nickel 34 and gold 36 are approximately 10 microns, for example. In another embodiment a layer of copper (not shown) can be provided between metallization paths 24, 26 and their respective layers of nickel 34 to provide a taller bump structure thereto. In another embodiment, a mask layer 38 is applied to the second side 28 of flex material 2 while leaving feed-thru pads 30, 32 exposed. Although FIG. 4 illustrates a single layer of dielectric flex material 2 having metallization paths 24, 26 thereon, the invention is not limited to a single layer, but may include multiple layers of flex material 2 and feed-thrus to the other dielectric layers using feed-thrus such as metallization paths 24, 26. As such, a plurality of layers and interconnects may be fabricated, according to the invention.

Figure 5:
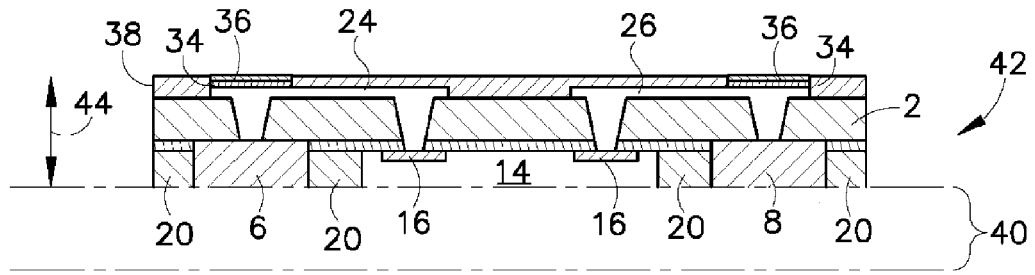

Referring to FIGS. 4 and 5, a portion 40 of first chip scale package layer 4 is removed via grinding/lapping to expose materials 6, 8 to form a chip scale package layer 42 from sub-assembly 23 of FIG. 4. The removed portion 40 includes portions of encapsulant 20, portions of the bulk material of die 14 and a portion of materials 6, 8. As such, FIG. 5 illustrates chip scale package layer 42 that may be stacked according to embodiments of the invention to form a multi-layer package. Mask layer 38 and flex material 2 serve as a support structure during the removal process, thus portion 40 may be removed such that materials 6, 8 and die 14 have a final layer thickness 44 of less than 50 microns, for example. Thus, the total package or layer thickness 44, including materials 6, 8 and die 14, flex material 2, and metallization paths 24, 26 with layers of nickel 34 and gold 36, may be, for example, approximately 100 microns in thickness. Further, one skilled in the art will recognize that the final layer thickness 44 may be thicker or thinner than 100 microns depending on the amount of material removed or the amount of material applied. For instance, one skilled in the art will recognize that die 14 may include a final thickness of 10-20 microns, or that a kapton thickness of 10 microns may be used, as examples. In addition, one skilled in the art will recognize that the thicknesses illustrated in the figures are not shown to scale, nor are they in proportion to the thicknesses of the respective components as discussed above. Thus, a thin device 42 is formed having electrical contacts or materials 6, 8 and feedthru pads 30, 32 that can be stacked and electrically connected one to another to form a multi-layer electrical package.

One skilled in the art will recognize that FIG. 5 illustrates but one cross-section of first chip scale package layer 4 and that the pattern of materials 6, 8 and their connection to contact pads 16 by metallization layers 24, 26 may be different in different embodiments.

Figure 6:
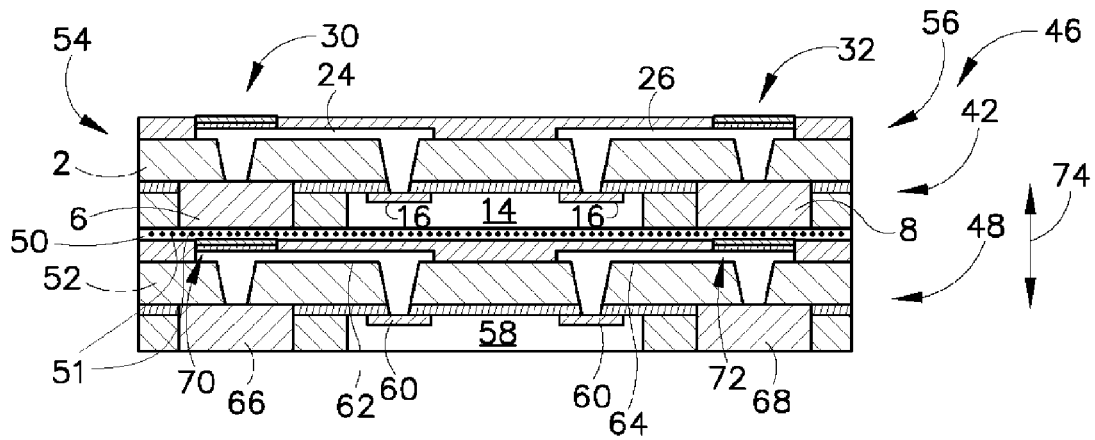
FIG. 6 is a schematic block diagram showing a multi-layer chip scale package in accordance with an embodiment of the invention.

Referring now to FIG. 6, a multi-layer electronic package 46 may be formed having the first sub-assembly or first chip scale package layer 42 of FIG. 5 stacked and interconnected to a second sub-assembly or chip scale package second layer 48 according to embodiments of the invention. Second chip scale package layer 48, in this embodiment, is similar to first chip scale package layer 42 as described above. The two layers 42, 48 include an anisotropic conductive paste (ACP) 50, such as Namics ECS5 materials, positioned therebetween. Other ACP materials or Anisotropic Conductive Films (ACF) may be used according to embodiments of the invention. The two layers 42, 48 are formed via embodiments of the invention shown in FIGS. 1-5. According to embodiments of the invention, layers 42, 48 may be aligned relative to one another by use of a pick and place robotic device and use of fiducial reference points. In another example, layers 42, 48 may be aligned relative to one another via a pinned fixture (not shown). In this example, flex material 2 of layer 42 and flex material 52 of layer 48 may extend beyond each end 54, 56 and components of each layer 42, 48 may be aligned relative to, for instance, a reference hole or holes in flex material 2 and then the hole or holes in flex material 2 may be used to align each layer 42, 48 during assembly thereof.

Referring still to FIG. 6, first chip scale package layer 42 includes die 14 having contact pads 16 and metallization layers 24, 26 attached thereto and connecting contact pads 16 to respective materials 6, 8 and to respective feed-thru pads 30, 32. Likewise, second chip scale package layer 48 includes a die 58 having contact pads 60 and metallization layers 62, 64 attached thereto and connecting contact pads 60 to respective materials 66, 68 and to respective feed-thru pads 70, 72. Multi-layer electronic package 46 includes ACF or ACP 50 positioned between first chip scale package layer 42 and second chip scale package layer 48. Feed-thru pads 70, 72 of second chip scale package layer 48 are electrically connected to respective materials 6, 8 of first chip scale package layer 42, which are likewise connected to respective feed-through pads 30, 32 of first chip scale package layer 42.

Following is a description related to an ACP, however it is to be recognized that such description is likewise applicable to an ACF or other anisotropically conducting material or product. An ACP typically is a material used for connecting two nodes or surfaces within an electrical circuit. Typically, the ACP includes a conductive filler positioned or diffused within a binder, such as epoxy or a thermosetting resin. The conductive filler may include, as an example, solder spheres of SnBi. In one example, the solder spheres have a diameter of 7 microns. Thus, ACP may be used to join components or surfaces such that a final thickness of, for instance, 7 microns or less is achieved or achievable, depending on the solder ball diameter and its processing conditions (such as, for instance, after reflow when a final thickness of the solder may be less than the initial of 7 microns, as in the example). ACPs are typically applied to surfaces of electrical components, and the electrical components are compressed and heated to cure the binder while causing the conductive filler to flow therein.

In such fashion, the ACP serves to electrically interconnect the electrical components between which it is cured. Because the conductive filler of the ACP typically includes solder balls 51, the solder balls 51 tend to melt or reflow and adhere to or contact the surfaces of the electrical components, causing an electrical connection thereto. Also, some versions of ACP include non-soldering components (i.e. metallic polymeric spheres) that accomplish an electrical connection by simply pressing materials together and do not include a melt or reflow step. As such, because of the electrical conductivity of the conductive filler, the two electrical surfaces are electrically connected. Because the reflowed conductive filler is separated by a binder, an ACP typically causes an electrical connection to occur only between the electrical components having reflowed conductive filler therebetween. Thus, an ACP can be used to attach and interconnect components between, for instance, two planar surfaces having a number of electrical contact pads therein. However, because the binder of the ACP precludes electrical current from flowing in a direction perpendicular to the surfaces joined by the ACP, an ACP provides a convenient and inexpensive material for electrically interconnecting planar surfaces.

Referring back to FIG. 6, because of the electrical properties of ACP 50, ACP 50 conducts in a general direction 74 of layer stacking. As an example, although material 6 of first chip scale package layer 42 is electrically connected to feed-thru pad 70 of second chip scale package layer 48, materials 6 and 8 are precluded from electrical contact one to the other via ACP 50. Likewise, feed-thru pad 70 and feed-thru pad 72 are precluded from electrical contact one to another via ACP 50. In such fashion, ACP 50 provides a method of attaching layers 42 and 48 and electrically connecting components or contact pads therebetween while precluding undesirable shorting to occur between other components. As shown, feed-thru pads 30 and 70 are coupled together, and feed-thru pads 32 and 72 are coupled together. Thus, as an example, electrical signals such as power, ground, and digital signals maybe respectively directed and controlled according to embodiments of the invention. In one embodiment of the invention, layers 42 and 48 are stacked and attached one to another via the use of an electrically conducting material such as solder. In this embodiment, a solder 50 is applied, but is only selectively applied to regions between pads or materials that are desired to be electrically connected. For instance, solder may be used to electrically connect material 6 with pad 70, and solder may be used to electrically connect material 8 with pad 72. Thus, by selectively applying solder, in this and all subsequent embodiments, layers may be stacked and interconnected by use of a metal such as a solder instead of ACP, ACF, and the like.

Figure 7:
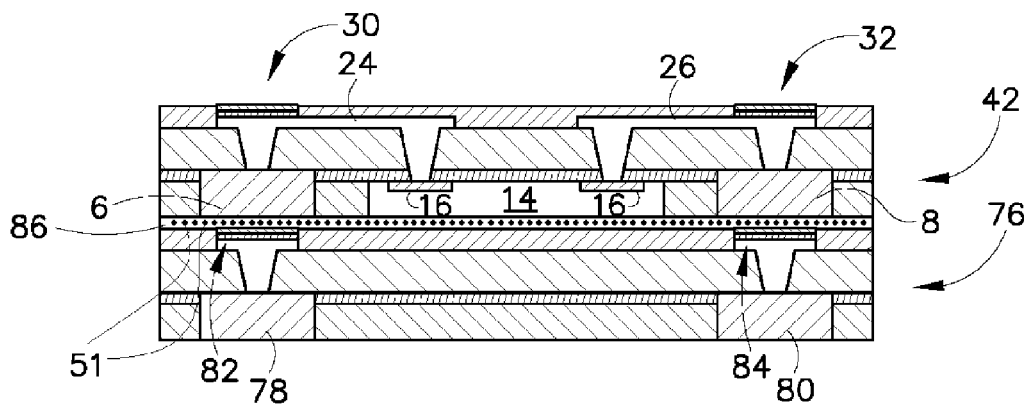
FIG. 7 is a schematic block diagram showing a multi-layer chip scale package in accordance with an embodiment of the invention.

Furthermore, layouts may vary from layer to layer according to embodiments of the invention. For instance, referring to FIG. 7, layers 42 and 76 illustrate another layout according to an embodiment of the invention. In this embodiment, layer 42 includes materials 6, 8 and includes die 14. First chip scale package layer 42 includes feed-thru pads 30, 32 connected to pads 16 of die 14 via metallization layers 24, 26. Layer 76, however, does not include a die in this embodiment, but includes materials 78, 80 that are electrically connected by feed-thru vias 82, 84 that are formed in the fashion as described above with respect to FIGS. 1-5. Thus, in this embodiment, feed-thru vias 82, 84 and materials 78, 80 may be directly connected to respective materials 6, 8 to carry signals from layer to layer by use of an ACP 86 according to embodiments of the invention. Further, it is to be recognized that FIG. 7 illustrates one example of a two-layer set of interconnects, one having a die 14 therein and the other having no die.

The embodiments illustrated herein may be used to interconnect components from layer to layer, and each layer may be designed having varying and different patterns that re-route signals within a layer and from layer to layer to support carrying signals from die in one layer to a surface of another. Further, one skilled in the art will recognize that the number of layers need not be limited to two, but may include many layers that can be each electrically or thermally connected one to the other by an ACP material. Additionally, one skilled in the art will recognize that metallization paths 24, 26, 62, and 64 of FIG. 6 (as examples), and their respective vias, may be designed having improved thermal properties to better transfer heat between layers. Thus, metallization paths 24, 26, 62, and 64 may be appropriately designed to provide favorable and improved electrical and thermal conductivity between components and between layers, according to embodiments of the invention.

The layers may be designed having zero, one, or multiple devices therein, and the patterns may be many and varied within each layer to support any number of readout patterns. As such, according to embodiments of the invention, a multi-layer chip package or electronic circuit may be fabricated having a very thin total package thickness. For instance, as discussed with respect to fabrication of each layer and described with respect to FIGS. 1-5, each layer may be fabricated having a thickness of approximately 50 microns. Thus, as an example, a final package having 8 layers therein may be fabricated having a total thickness of approximately 400 microns. However, as stated, each layer may be thicker or thinner than 50 microns, thus the total package thickness may be controlled, according to embodiments of the invention.

According to an embodiment of the invention, referring back to FIG. 6, dies 14, 58 are configured to perform identical tasks. For example, dies 14, 58 may be of one die type configured to perform memory functions or processor functions. However, according to another embodiment of the invention, dies 14, 58 are not all configured to perform identical tasks or to be of the same die type, and may be active or passive electrical components. Die types may be, for example, a memory chip, a microprocessor, a translation circuit, a buffer, a switch, and passive components such as a resistor, a capacitor, and an inductor. For example, die 14 may be configured as a memory chip while die 58 may be configured as a microprocessor chip.

As discussed, the layers that are interconnected via ACP may have alternate configurations. Thus, FIGS. 8-12 illustrate varying layer configurations that may be interconnected via ACP according to embodiments of the invention. Further, although ACP is discussed as the interconnect between layers, as stated, solder or other electrical means may be used to interconnect the layers of the embodiments of FIGS. 8-12, according to embodiments of the invention.

Referring to FIG. 8, layer 88 includes a die 90 connected to materials 92, 94, and electrical isolation is accomplished using two layers of dielectric 96, 98. Layer 88 includes feed-thru pads 100, 102 connected to die 90 by metallization layers 104 and connected between dielectric layers 96, 98 by vias 106 as illustrated. As is evident, vias 106 may pass through a single dielectric layer or may pass through both.

FIG. 9 illustrates layer 108 according to another embodiment of the invention. According to this embodiment, layer 108 includes multiple dies 110 connected to materials 112, 114 by metallization layers 116. Thus, feed-thru pads 118, 120 may be connected to materials 112, 114 and to multiple dies 110 as illustrated.

FIG. 10 illustrates two layers 122, 124 according to another embodiment of the invention. According to this embodiment, each layer 122, 124 includes multiple dies 126 connected to materials 128 by a plurality of metallization layers 130. Feed-thru pads 132 may likewise be included in multiple locations, as illustrated. An ACP 134 is included to interconnect the two layers, according to embodiments of the invention.

Larger and smaller layer packages may be combined one with the other as illustrated in FIGS. 11 and 12. For instance, FIG. 11 illustrates a first layer 136 and two second layers 138, 140 that are interconnected to materials 142 and to feed-thru pads 144 by metallization layers 146. Layer 136 and layers 138, 140 are separated and electrically connected one to another using ACP 148, according to embodiments of the invention.

FIG. 12 illustrates a combination of layers having differing numbers of layers in different locations. Layer 150 thus includes two dies 152 and pads 154 and interconnects 156 thereon. Layer 150 includes one additional layer 158 in a first location 160, but then includes two additional layers 162, 164 positioned at a second location 166. As in previous embodiments, the various layers are interconnected via an ACP 168, according to the invention.

Thus, as illustrated, layers may be fabricated having varying numbers of zero, one, or a plurality of dies therein. The dies may be connected to materials within each layer by use of vias and metallization layers, and the layers may be electrically connected one to the other by use of an ACP. The layers may be stacked having two, three, or many layers, and the size and thickness of each layer may vary.

Figure 13:
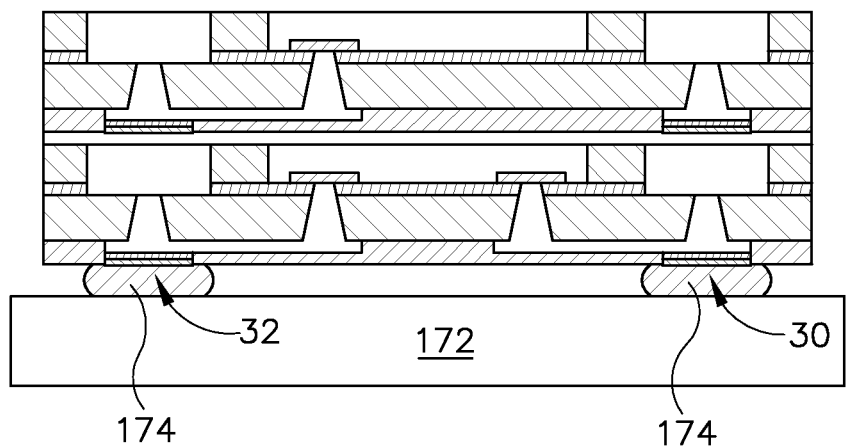
FIG. 13 is a multi-layer chip scale package attached to a printed circuit board (PCB) according to an embodiment of the invention.

The multi-layer packages described herein may be applied to a board, such as a printed circuit board (PCB), as illustrated in FIG. 13. As an example, multi-layer electronic package 46 of FIG. 6 may be applied to a PCB 172 by a plurality of solder bumps or balls 174. As such, feed-thru pads feed-thru pad 30 and 32 may be attached to PCB 172 to provide a support structure, additional functionality, or an ability to interconnect with other multi-layer packages (not shown). Solder balls 174 may each be a solder ball of an array of solder balls, such as in a ball grid array (BGA), according to embodiments of the invention. Thus, dies buried within a multi-layer package may communicate electrically with PCB 172 and to other components of an electrical circuit, as an example. Further, one skilled in the art will recognize that solder bumps or balls are not the only method to attach to the PCB, and that other techniques can be used such as wirebonding, silver epoxy, ACP, ACF, as examples. Further, although solder bumps 174 are illustrated as surface mount elements, one skilled in the art will recognize that embedded structures or cavities (not shown) can be included in PCB 172 such that the balls 174 have a reduced stack-height or profile. In such fashion the overall stack height may be reduced according to embodiments of the invention. Further, one skilled in the art will recognize that PCB 172 may be but one of many layers stacked within layers of electronic packages 46 according to embodiments of the invention. In other words, multiple layers of packages 46 may be combined with multiple PCBs 172 to form combined packages of components, according to embodiments of the invention.

According to one embodiment of the invention, an electronic package includes a first layer having a first surface, the first layer includes a first device having a first electrical node, and a first contact pad in electrical communication with the first electrical node and positioned within the first surface. The package includes a second layer having a second surface and a third surface, the second layer includes a first conductor positioned within the second surface and a second contact pad positioned within the third surface and in electrical communication with the first conductor. A first anisotropic conducting paste (ACP) is positioned between the first contact pad and the first conductor to electrically connect the first contact pad to the first conductor such that an electrical signal may pass therebetween.

According to another embodiment of the invention, a method of fabricating an electronic package includes forming a first sub-assembly layer having a first silicon device therein, the first sub-assembly layer having a first surface, forming a first interface material in the first sub-assembly layer such that the first surface includes the first interface material, electrically connecting a node of the first silicon device to the first interface material, and forming a second sub-assembly layer having a second surface and a third surface. The method further includes forming a conductor in the second sub-assembly layer such that the second surface includes the conductor, forming a second interface material in the second sub-assembly layer such that the third surface includes the second interface material, electrically connecting the conductor to the second interface material, and compressing an anisotropic conductive paste (ACP) between the first sub-assembly layer and the second sub-assembly layer such that the first interface material is electrically connected with the conductor.

According to another embodiment of the invention, an electronic package includes a plurality of die package sub-layers, each sub-layer having a first surface and a second surface. Each sub-layer includes a device having one or more electrical nodes, a first contact pad electrically connected to one of the one or more electrical nodes, the first surface comprising the first contact pad, a second surface comprising a conductor, and an electrical feedthrough configured to pass an electrical signal from the conductor to the first contact pad. A paste including a plurality of solder balls that conduct electrical signals is positioned between the plurality of sub-layers such that the first contact pad of one sub-layer is electrically connected to the conductor of an adjacent sub-layer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of fabricating an electronic package, the method comprising:
   forming a plurality of die package sub-layers, each sub-layer having a first surface and a second surface, wherein forming each sub-layer comprises:
   providing a device having one or more electrical nodes;
   adhering the device to a flex layer, on a first surface of the sub-layer;
   forming a via through the flex layer at a location adjacent each of the one or more electrical nodes;
   forming a metallization layer that provides a direct metallic connection to each of the one or more electrical nodes, the metallization layer extending down through the via adjacent each of the one or more electrical nodes;
   forming contact pads on the metallization layer such that the contact pads are located on the second surface of the sub-layer
   providing a conductor on the first surface of the sub-layer; and
   electrically connecting the conductor to an electrical node of the device via the metallization layer, the metallization layer comprising a feed-thru extending through the flex layer to electrically connect the metallization layer to the conductor ; and
   compressing an anisotropic conductive paste (ACP) between the plurality of sub-layers such that the contact pad of one sub-layer is electrically connected to the conductor of an adjacent sub-layer via the ACP, wherein the ACP comprises a plurality of solder balls that conduct electrical signals.

2. The method claim 1 wherein compressing the ACP includes compressing the ACP to have a surface area that is substantially the same as one of an area of the first surface and an area of the second surface of one of the sub-layers.

3. The method of claim 1 wherein the device in each sub-layer comprises one of a memory chip, a microprocessor, a translation circuit, a buffer, a switch, a resistor, a capacitor, and an inductor.

4. The method of claim 1 wherein the conductor in each sub-layer comprises copper.

5. The method of claim 1 further comprising electrically connecting the plurality of die package sub-layers to a printed circuit board (PCB), with the plurality of die package sub-layers passing electrical signals to the PCB via the conductor of one of the sub-layers.

6. The method of claim 5 further comprising electrically attaching the plurality of die package sub-layers to the PCB via a ball grid array (BGA).

7. The method of claim 1 wherein forming each sub-layer further comprises applying an encapsulant to the first surface of the sub-layer, such that the device and the conductor are embedded in the encapsulant.

8. The method of claim 7 wherein forming each sub-layer further comprises performing one of a grinding and a lapping operation to remove a portion of the encapsulant, a portion of the device, and a portion of the conductor, wherein a surface of the conductor is exposed upon performing the one of the grinding and the lapping operation.

* * * * *